United States Patent
Visokay et al.

(10) Patent No.: US 7,135,361 B2
(45) Date of Patent: Nov. 14, 2006

(54) METHOD FOR FABRICATING TRANSISTOR GATE STRUCTURES AND GATE DIELECTRICS THEREOF

(75) Inventors: Mark R. Visokay, Richardson, TX (US); Luigi Colombo, Dallas, TX (US); James J. Chambers, Dallas, TX (US); Antonio L. P. Rotondaro, Dallas, TX (US); Haowen Bu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 49 days.

(21) Appl. No.: 10/734,708

(22) Filed: Dec. 11, 2003

(65) Prior Publication Data

US 2005/0130442 A1 Jun. 16, 2005

(51) Int. Cl.
*H01L 21/336* (2006.01)
(52) U.S. Cl. .................. 438/197; 438/199; 438/785
(58) Field of Classification Search .............. 438/3, 438/197, 199, 216, 287, 591, 778, 785
See application file for complete search history.

(56) References Cited

U.S. PATENT DOCUMENTS

| | | | |
|---|---|---|---|
| 5,352,623 | A | 10/1994 | Kamiyama |
| 5,891,809 | A | 4/1999 | Chau et al. |
| 6,013,553 | A | 1/2000 | Wallace et al. |
| 6,015,739 | A | 1/2000 | Gardner et al. |
| 6,020,243 | A | 2/2000 | Wallace et al. |
| 6,136,654 | A | 10/2000 | Kraft et al. |
| 6,251,761 | B1 | 6/2001 | Rodder et al. |
| 6,291,866 | B1 | 9/2001 | Wallace et al. |
| 6,291,867 | B1 | 9/2001 | Wallace et al. |
| 6,436,801 | B1 | 8/2002 | Wilk et al. |
| 6,544,906 | B1 | 4/2003 | Rotondaro et al. |
| 6,624,090 | B1 | 9/2003 | Yu et al. |
| 6,642,131 | B1 * | 11/2003 | Harada ................ 438/591 |
| 6,809,370 | B1 * | 10/2004 | Colombo et al. ......... 257/310 |
| 6,875,678 | B1 * | 4/2005 | Jung et al. ............. 438/591 |
| 2003/0045080 | A1 * | 3/2003 | Visokay et al. ......... 438/591 |
| 2003/0052358 | A1 | 3/2003 | Weimer |
| 2003/0080389 | A1 | 5/2003 | Hu et al. |
| 2003/0129817 | A1 * | 7/2003 | Visokay et al. ......... 438/591 |

OTHER PUBLICATIONS

"Fabrication of HfSiON Gate Dielectrics by Plasma Oxidation and Nitridation, Optimized for 65nm node Low Power CMOS Applications", Seiji Inumiya, Katsuyuki Sekine, Shoko Niwa, Akio Kaneko, Motoyuki Sato, Takeshi Watanabe, Hironobu Fukui, Yoshiki Kamata, Masato Koyama, Akira Nishiyama, Mariko Takayanagi, Kazuhiro Eguchi and Yoshitaka Tsunashima, 2003 Symposium on VLSI Technology Digest of Technical Papers, 2 pgs.

* cited by examiner

*Primary Examiner*—Thanhha S. Pham
(74) *Attorney, Agent, or Firm*—Jacqueline J. Garner; W. James Brady, III; Frederick J. Telecky, Jr.

(57) ABSTRACT

Methods are disclosed for treating deposited gate dielectric materials, in which the deposited dielectric is subjected to one or more non-oxidizing anneals to densify the material, one or more oxidizing anneals to mitigate material defects, and to a nitridation process to introduce nitrogen into the gate dielectric. The annealing may be performed before and/or after the nitridation to mitigate deposition and/or nitridation defects and to densify the material while mitigating formation of unwanted low dielectric constant oxides at the interface between the gate dielectric and the semiconductor substrate.

40 Claims, 5 Drawing Sheets

METHOD FOR FABRICATING TRANSISTOR GATE STRUCTURES AND GATE DIELECTRICS THEREOF

RELATED APPLICATIONS

This application is related to U.S. patent application Ser. No. 10/185,326, filed on Jun. 28, 2002, entitled ANNEAL SEQUENCE FOR HIGH-K FILM PROPERTY OPTIMIZATION; U.S. patent application Ser. No. 10/232,124, filed on Aug. 30, 2002, entitled GATE STRUCTURE AND METHOD; and U.S. Pat. No. 6,544,906, filed Oct. 25, 2001, entitled ANNEALING OF HIGH-K DIELECTRIC MATERIALS, wherein the entirety of these applications and patents are hereby incorporated by reference as if fully set forth herein.

FIELD OF INVENTION

The present invention relates generally to semiconductor devices and more particularly to methods for fabricating and treating high dielectric constant gate dielectrics for MOS transistor gate structures.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS), in which a gate is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-channel and p-channel (NMOS and PMOS) transistors are used to fabricate logic and other circuitry.

The source and drain are typically formed by adding dopants to targeted regions of a semiconductor body on either side of the channel. A gate structure is formed above the channel, having a gate dielectric formed over the channel and a gate electrode above the gate dielectric. The gate dielectric is an insulator material, which prevents large currents from flowing into the channel when a voltage is applied to the gate electrode, while allowing such an applied gate voltage to set up an electric field in the channel region in a controllable manner. Conventional MOS transistors typically include a gate dielectric formed by depositing or growing silicon dioxide ($SiO_2$) over a silicon wafer surface, with doped polysilicon formed over the $SiO_2$ to act as the gate electrode.

Continuing trends in semiconductor device manufacturing include reduction in electrical device feature sizes (scaling), as well as improvements in device performance in terms of device switching speed and power consumption. MOS transistor performance may be improved by reducing the distance between the source and the drain regions under the gate electrode of the device, known as the gate or channel length, and by reducing the thickness of the layer of gate oxide that is formed over the semiconductor surface. However, there are electrical and physical limitations on the extent to which thickness of $SiO_2$ gate dielectrics can be reduced. For example, very thin $SiO_2$ gate dielectrics are prone to large gate tunneling leakage currents resulting from direct tunneling through the thin gate oxide. In addition, there are conventional limitations on the ability to form such thin oxide films with uniform thickness. Furthermore, thin $SiO_2$ gate dielectric layers provide a poor diffusion barrier to dopants, for example, and may allow high boron dopant penetration into the underlying channel region of the silicon during fabrication of the source/drain regions.

Recent MOS transistor scaling efforts have accordingly focused on high-k dielectric materials having dielectric constants greater than that of $SiO_2$ (e.g., greater than about 3.9), which can be formed in a thicker layer than scaled $SiO_2$, and yet which produce equivalent field effect performance. The relative electrical performance of such high-k dielectric materials is often expressed as equivalent oxide thickness (EOT), because the high-k material layer may be thicker, while still providing the equivalent electrical effect of a much thinner layer of $SiO_2$. Since the dielectric constant "k" is higher than that of silicon dioxide, a thicker high-k dielectric layer can be employed to mitigate tunneling leakage currents, while still achieving the equivalent electrical performance of a thinner layer of thermally grown $SiO_2$, nitrided $SiO_2$, or SiON.

The performance and reliability of the resulting MOS transistors is dependent upon the quality of the high-k gate dielectric material, including the bulk high-k material and also the quality of the interface region between the high-k gate dielectric material and the underlying silicon. Unlike $SiO_2$, which may be formed by thermal oxidation (growth process), high-k dielectrics are typically deposited over the semiconductor substrate, using chemical vapor deposition (CVD), physical vapor deposition (PVD), atomic layer deposition (ALD), molecular beam epitaxy (MBE), or other deposition processes. While the macroscopic composition (e.g., stoichiometry) of these materials may be controlled to a certain extent during such deposition processes, stoichiometric composition variations within the film may degrade device performance.

In addition, the above deposition techniques often create high-k dielectric films having point defects that affect transistor performance. Such defects may include oxygen vacancies, and/or other point defects affecting leakage through the gate dielectric. Furthermore, certain deposition processes (e.g., CVD, ALD, etc.) may introduce impurities (e.g. Cl, C, OH, H, etc.) into the deposited high-k dielectric film, which also degrade device performance. Moreover, the deposited film may not be of optimal density, wherein sub par performance may result. Accordingly, there is a need for improved gate dielectric fabrication techniques by which high quality gate dielectrics and interfaces can be achieved.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention provides methods for treating deposited high-k gate dielectric films and gate fabrication techniques, by which improved gate dielectric materials may be realized. A deposited dielectric film or layer is subjected to one or more non-oxidizing anneals to densify the material and one or more oxidizing anneals to mitigate material defects. In addition, the film is nitrided to inhibit dopant diffusion and to thermally stabilize the deposited material. The nitridation may be done first, or one or more of the anneals can be performed prior to nitridation to densify and/or heal defects resulting from the initial deposition process. After nitridation, one or more anneals may be performed to address any defects, impurities, etc. introduced during the nitridation, wherein the post-nitridation annealing may be performed at high temperatures without crystallization, due to the presence of nitrogen in the film.

One aspect of the invention combines a post-deposition nitridation process with two or more post-deposition anneal operations, where one is oxidizing and one is non-oxidizing. In accordance with this aspect, a method is provided for treating a deposited high-k gate dielectric layer during fabrication of a semiconductor device. The method comprises nitriding a deposited high-k gate dielectric layer, performing a first anneal in a non-oxidizing ambient, and performing a second anneal in an oxidizing ambient. In one implementation, the nitridation is done prior to both the anneal processes, with the non-oxidizing anneal being done last (e.g., prior to depositing the gate electrode material). In another implementation, the non-oxidizing anneal is done prior to nitridation. Either implementation may be used in conjunction with nitrogen-containing high-k materials or with materials initially deposited with no nitrogen content, wherein the nitridation step may improve thermal stability of the deposited material in either case.

Another aspect of the invention provides a post-deposition nitridation process, along with one or more pre-nitridation anneal processes and one or more post-nitridation anneal processes to treat the high-k material. In one example, the pre-nitridation anneals include a first anneal at a moderate temperature in a non-oxidizing ambient that operates to densify the deposited high-k material, wherein the temperature of the first anneal may be adjusted to avoid crystallizing the material, particularly important for deposited films initially having no nitrogen content. A second pre-nitridation anneal is then performed at moderate temperatures in an oxidizing ambient to reduce or eliminate defects and impurities in the high-k dielectric before nitridation. The post nitridation annealing in this example includes a third anneal process performed at a high temperature in a non-oxidizing ambient to densify the material, followed by a fourth anneal at a somewhat lower temperature in an oxidizing ambient to control point defects.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
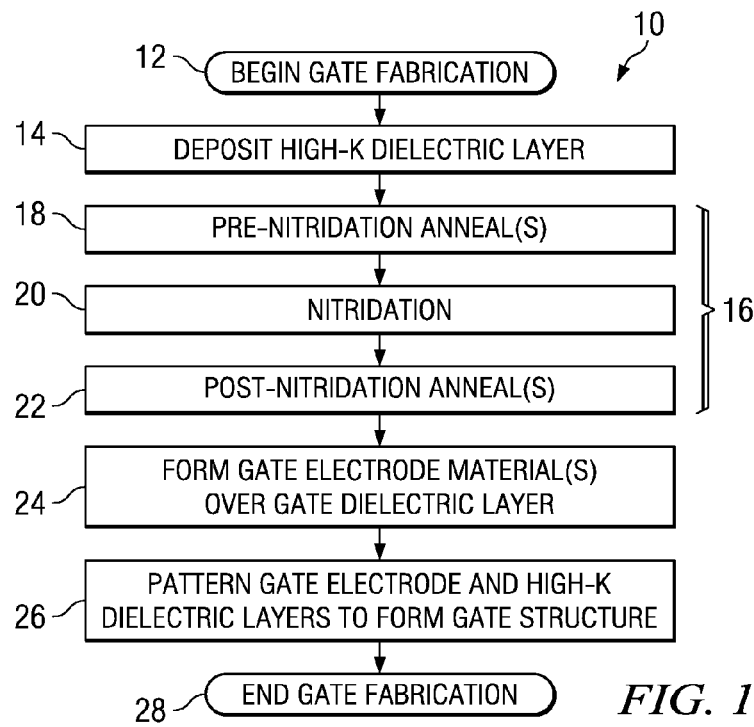
FIG. 1 is a simplified flow diagram illustrating an exemplary method of fabricating transistor gate structures in accordance with the present invention.

One or more implementations of the present invention will now be described with reference to the attached drawings, wherein like reference numerals are used to refer to like elements throughout, and wherein the devices and structures illustrated in the figures are not necessarily drawn to scale.

The invention relates to post-deposition treatment of deposited high-k gate dielectric films to densify the material, heal defects, and to thermally stabilize the material through multiple anneal processes and a nitridation process. The methods of the invention can be employed following high-k deposition and before formation of gate electrode materials over the high-k, to improve the high-k material quality (e.g., reduce point and other defects, densify the material, remove impurities, etc.). The techniques of the invention may be employed in conjunction with any high-k dielectric materials having a dielectric constant "k" greater than that of $SiO_2$ (e.g., greater than about 3.9), and are independent of the particular deposition process used to initially form the high-k film. In addition, the invention may be employed in devices fabricated using any semiconductor body (e.g., silicon substrates, SOI wafers, etc.), and may be used in transistors having any type of gate electrode material(s) (e.g., polysilicon, metal gates, etc.).

Referring initially to FIG. 1, a gate fabrication method 10 is hereinafter illustrated and described in accordance with one or more aspects of the present invention. Although the exemplary method 10 and other methods of the invention are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Further, the methods according to the present invention may be implemented in association with the formation and/or processing of structures illustrated and described herein as well as in association with other structures and devices not illustrated.

Beginning at 12, the method 10 comprises depositing a high-k gate dielectric layer at 14. Any dielectric may be deposited at 14 having a dielectric constant higher than that of $SiO_2$, including but not limited to binary metal oxides including aluminum oxide ($Al_2O_3$), zirconium oxide ($ZrO_2$), hafnium oxide ($HfO_2$), lanthanum oxide ($La_2O_3$), yttrium oxide ($Y_2O_3$), titanium oxide ($TiO_2$), as well as their silicates and aluminates; metal oxynitrides including aluminum oxynitride (AlON), zirconium oxynitride (ZrON), hafnium oxynitride (HfON), lanthanum oxynitride (LaON), yttrium oxynitride (YON), as well as their silicates and aluminates such as ZrSiON, HfSiON, LaSiON, TaSiON, YSiON, ZrAlON, HfAlON, TaAlON, etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalate, bismuth titanate and others. Furthermore, any deposition process or processes may be employed in depositing the high-k film at 14, including but not limited to CVD, PVD, ALD, MBE, or others.

Following the high-k deposition at 14, a multi-step treatment is performed at 16, including one or more pre-nitridation anneals at 18, a nitridation process at 20, and one or more post-nitridation anneals at 22. As illustrated and described further below with respect to FIGS. 2 and 3A–3I, the multi-step treatment 16 may advantageously comprise first and second pre-nitridation anneals at 18, wherein a first anneal is performed at a moderate temperature in an inert non-oxidizing ambient for densifying the deposited high-k material, as well as a second pre-nitridation anneal at 18 that is performed in an oxidizing ambient for curing defects and eliminating impurities. Moreover, the post-nitridation annealing at 22 in the example below advantageously includes a third anneal performed at a high temperature in a non-oxidizing ambient to densify the thermally stabilized high-k material and a fourth anneal in an oxidizing ambient to reduce any remaining defects and impurities.

At 24, a gate electrode material (e.g., polysilicon, metals, metal silicides, metal oxides, metal nitrides, or stacks combinations thereof) is formed over the treated high-k dielectric, using any suitable deposition process. The gate dielectric and gate electrode material layers are then patterned at 26 (e.g., using suitable etch masks and reactive ion etching (RIE) or other selective material removal processes) to create a patterned gate structure over a prospective channel region of the underlying semiconductor body, and the gate fabrication method 10 ends at 28. Thereafter, further processing steps may be undertaken to complete fabrication of a finished MOS transistor, for example, including implantation of source/drain regions of the substrate (e.g., as well as implantation of a polysilicon gate electrode material), silicidation to form contacts over the gate and the source/drains, and metalization or interconnect processing (not shown).

Figure 2:
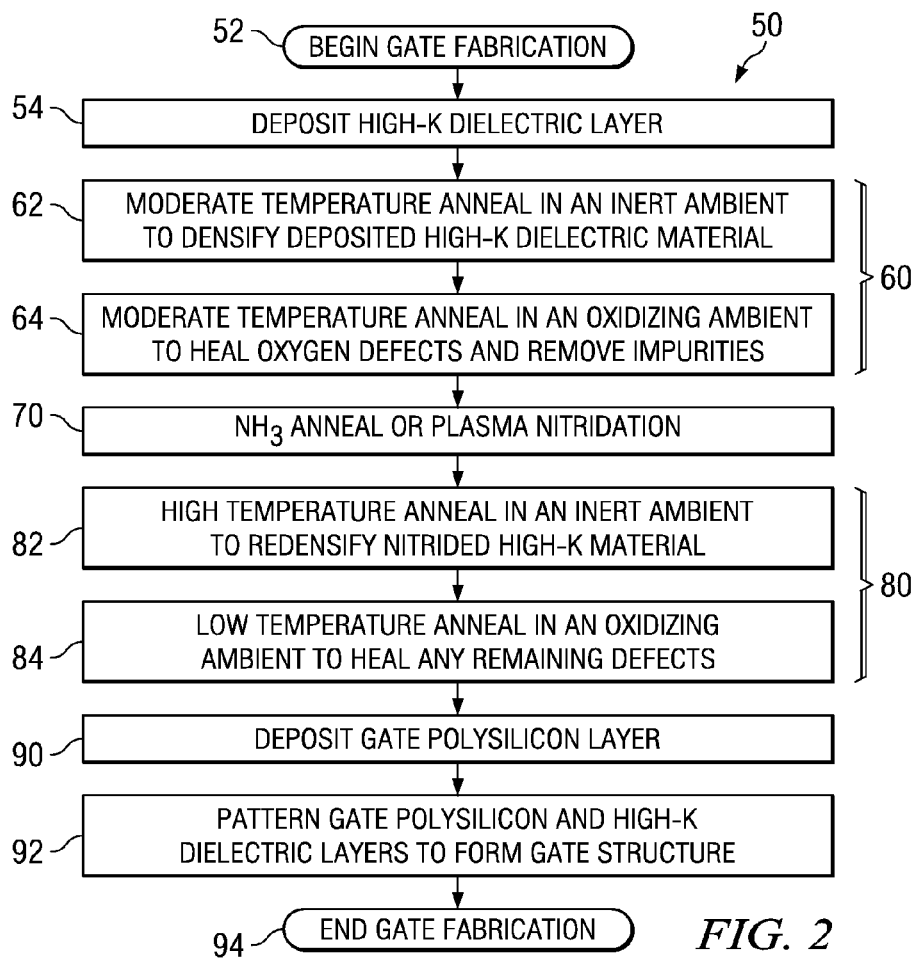
FIG. 2 is a flow diagram illustrating another exemplary method of fabricating transistor gate structures in accordance with the invention.

Referring now to FIGS. 2 and 3A–3I, an exemplary implementation of the invention is illustrated and described in the context of treating a deposited high-k dielectric prior to formation of a gate electrode material thereover. FIG. 2 illustrates a gate fabrication method 50 and FIGS. 3A–3I illustrate an exemplary semiconductor device 102 undergoing gate fabrication processing generally in accordance with the method 50. Beginning at 52 in FIG. 2, a high-k dielectric (e.g., such as those described above) is deposited or otherwise formed at 54 over or above a semiconductor body. In one example, HfSiO or HfSiON may be deposited over a silicon substrate at 54 via CVD, PVD, ALD, PECVD, PEALD, MBE, or other suitable deposition process.

Figure 3A:
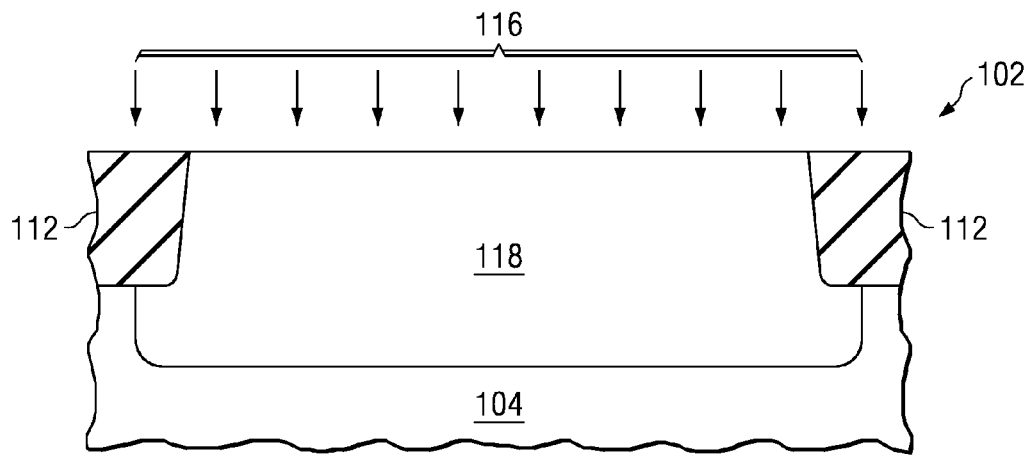
FIGS. 3A–3I are partial side elevation views in section illustrating a semiconductor device at various stages of fabrication processing wherein a high-k gate dielectric is formed and treated in accordance with the method of FIG. 2.
Figure 3B:
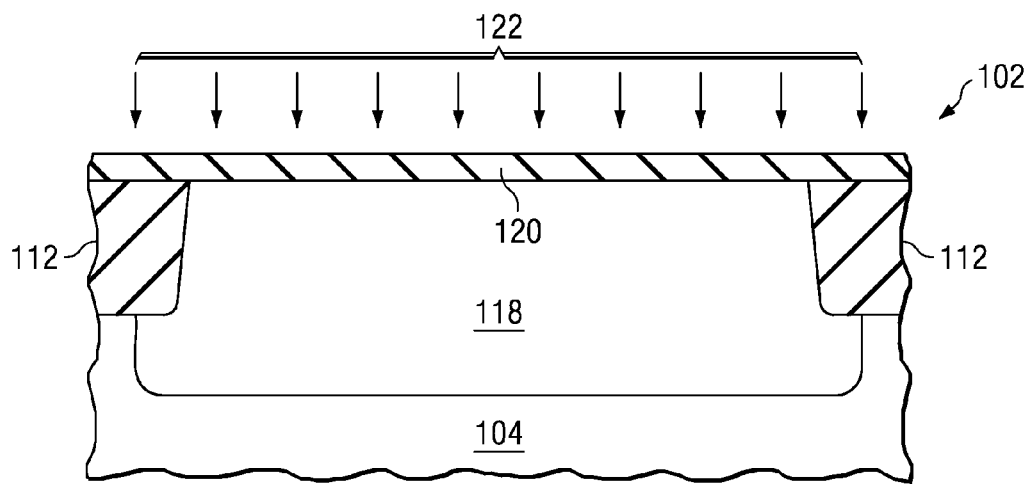

In FIG. 3A, the exemplary device 102 is illustrated after shallow trench isolation (STI) or field oxide (LOCOS) isolation structures 112 and one or more wells 118 have been formed in a silicon wafer substrate 104. A pre-deposition cleaning operation 116 is performed in FIG. 3A. In FIG. 3B, a CVD process 122 is used to deposit a HfSiO high-k dielectric layer 120 at a deposition temperature below about 700 degrees C. It is noted in this example, that other high-k materials may be deposited at 54 in the method 50, including those having nitrogen content (e.g., HfSiON, etc.). As noted above, the deposited high-k layer may include stoichiometric composition variations, defects that affect transistor performance (e.g., oxygen vacancies, and/or other point defects that may lead to gate dielectric leakage and/or interface states). In this regard, the deposition process at 54 may itself introduce impurities into the deposited high-k dielectric film, which also degrade device performance. For example, CVD or ALD deposited HfSiO may include undesirable C, OH, H, Cl, or other impurities, wherein ALD deposition is typically at a lower temperature (e.g., about 300 degrees C.) and the corresponding presence of C, OH, or Cl impurities is higher.

As discussed above, the optimization of the high-k dielectric film properties with respect to transistor performance is facilitated by film densification, nitrogen incorporation, and defect/impurity reduction through oxidation, wherein nitrogen incorporation may be preceded by densification. In addition, defect/impurity reduction can be facilitated by high temperature annealing, where nitrogen incorporation (e.g., thermal stabilization) facilitates the use of higher annealing temperatures without crystallizing the deposited high-k material. Low temperature oxidizing anneals avoid increases in the EOT of the material, but generally do not densify the material. At the same time, non-oxidizing high temperature anneals (e.g., Ar, He, or $N_2$ ambient) facilitate densification, but typically do not heal defects or adjust for non-stoichiometry.

It is noted with respect to HfSiO and HfSiON that while initially including nitrogen in the high-k material as deposited facilitates higher temperature annealing, HfSiO has been found to be easier to deposit at 54 than HfSiON. The same may be true of other non-nitrogen containing deposited high-k materials. Moreover, the introduction of further nitrogen into materials that initially contained nitrogen (e.g., HfSiON as deposited) is believed to benefit the high-k film properties and the resulting device performance. In this regard, a post-deposition nitridation can be used to fine tune the nitrogen content and profile throughout the depth of the high-k film, for example, with little or no nitrogen at the interface between the substrate and the high-k material.

Accordingly, to address these interrelationships between deposition processing, annealing, nitrogen incorporation, densification, defect/impurity reduction, etc., the exemplary method 50 includes a nitridation at 70, as well as pre and post nitridation annealing at 60 and 80, respectively, to reduce defects/impurities, densify the high-k material, and incorporate nitrogen therein, without creating unwanted low-k oxidation at the dielectric/substrate interface. In general, deposited materials that include nitrogen content (as deposited) may be annealed at somewhat higher temperatures at 60, wherein the pre and post-nitridation anneal temperatures can be tailored to prevent crystallization of the high-k material. For example, deposited HfSiO has been found to crystallize at about 900 degrees C., whereas HfSiON may be stable above about 1100 degrees C., depending on the composition (Hf to Si ratio and N to O ratio). The same general relationships are believed to be true for other high-k dielectrics, where nitrogen incorporation at 54 increases the thermal stability allowing higher anneal temperatures at 60, wherein such thermal stability considerations may be taken into account in determining both the pre and post nitridation anneal temperatures at 60 and 80, respectively.

At 60, pre-nitridation annealing of the high-k material is performed to address densification, defects, and impurity issues that may have arisen during the deposition at 54. A dual anneal sequence is employed at 60, including an inert anneal at 62 and an oxidizing anneal at 64. Suitable first and second anneal processes are described in U.S. patent application Ser. No. 10/185,326, assigned to the assignee of the present invention Texas Instruments Incorporated, the entirety of which is hereby incorporated by reference as if fully set forth herein. In the exemplary method 50, a first (pre-nitridation) anneal is performed at a moderate temperature at 62 in an inert non-oxidizing ambient, in order to initially densify the deposited high-k material.

Figure 3C:
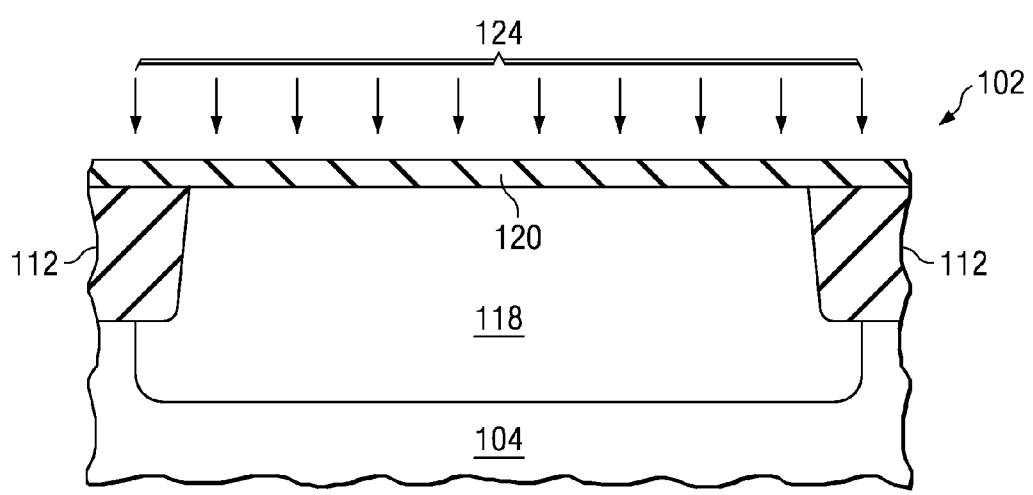

As illustrated in FIG. 3C, the device 102 undergoes a first anneal process 124 to densify the high-k material 120. The first anneal 124 occurs in a non-oxidizing ambient, for example, comprising Ar, He, or $N_2$ at a relatively high or moderate temperature, preferably in the range of 700° C. to 1100° C., for about 60 seconds in one example to densify the high-k gate dielectric 120. In the illustrated example of deposited HfSiO or HfSiON, the first anneal 124 (62 in FIG. 3) is performed at a temperature of about 1000 degrees C. or less (e.g., deposited HfSiON), preferably about 900 degrees C. or less (e.g., deposited HfSiO), such as about 700 to 900 degrees C., in a non-oxidizing ambient comprising $N_2$, Ar, He, Ne, or other inert gas environment. In this example, the first anneal at 62 operates to completely or partially densify the deposited high-k material wherein applying thermal energy allows the deposited atoms to slightly rearrange themselves into more stable positions, leaving fewer dangling bonds in a higher density material, without excessive atomic rearrangement (e.g., without crystallization or phase separation). This, in turn, leads to fewer interface states and lower dielectric leakage in the finished MOS transistor device 102.

Figure 3D:
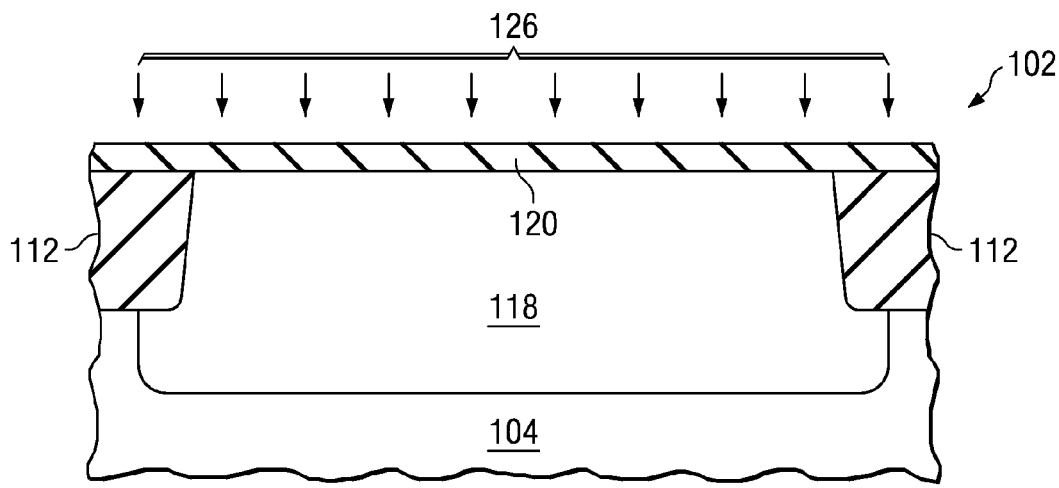
Figure 3E:
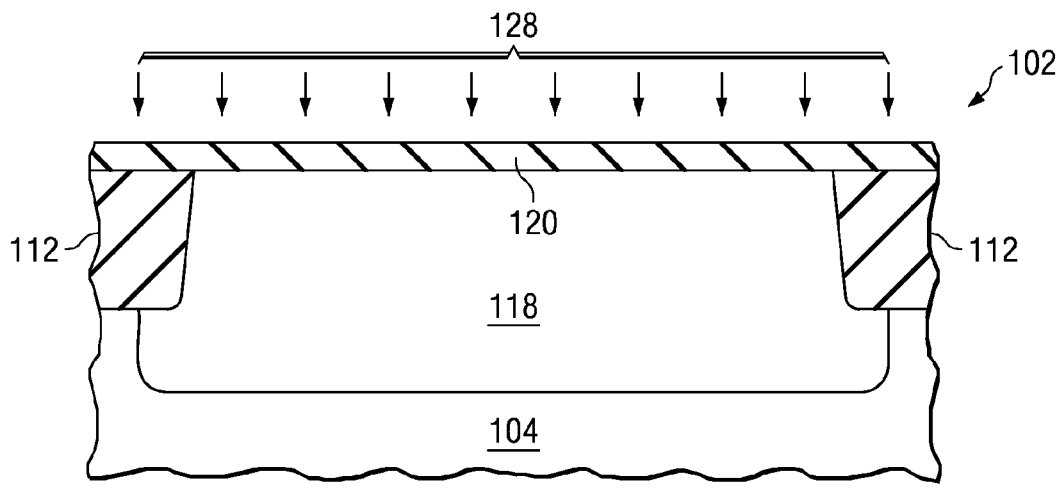
Figure 3F:
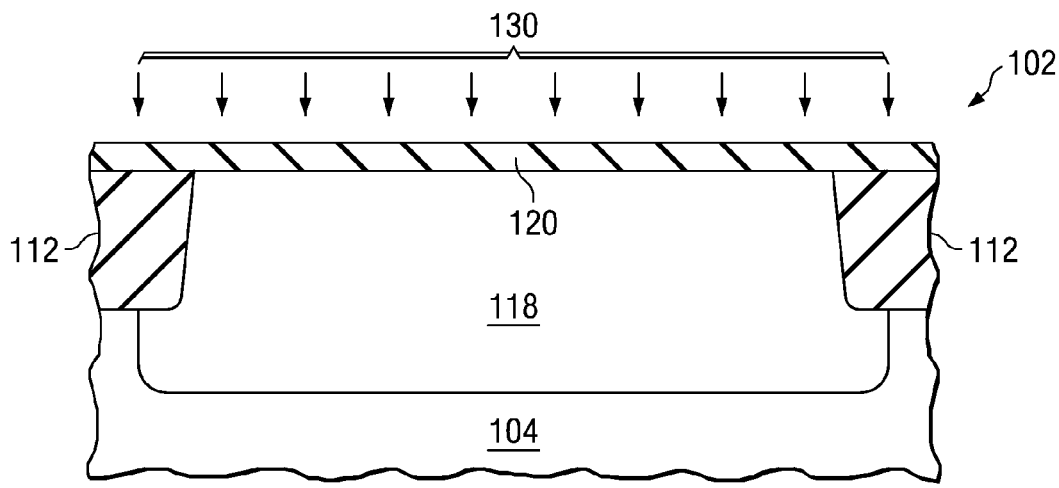
Figure 3G:
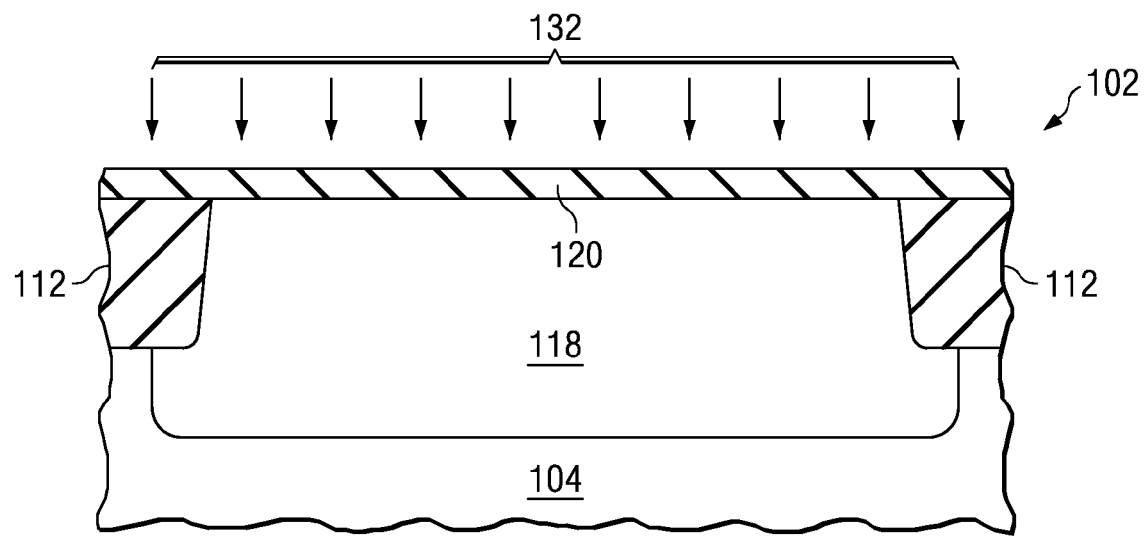
Figure 3H:
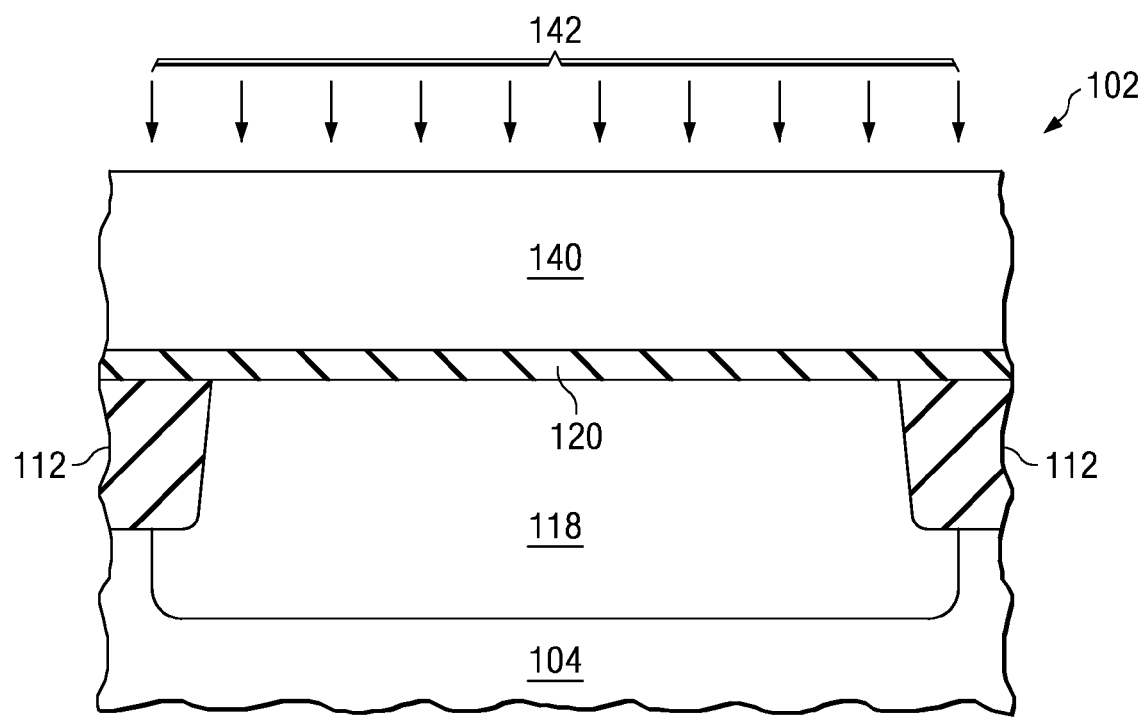

Referring also to FIG. 3D, a second anneal is performed at 64 (anneal process 126 in FIG. 3D), wherein an oxidizing ambient is used to heal oxygen defects, and to eliminate or reduce carbon, hydrogen, chlorine, or other impurities. In one implementation, the second anneal at 64 is performed at a temperature of about 1000 degrees C. or less, preferably about 700 degrees C. or less, at atmospheric pressure, preferably at a pressure of about 1 Torr or less. This second anneal at 64, moreover, can be any form of relatively mild anneal in an oxidizing ambient to heal the film and interface defects incurred during the deposition at 54. The oxidizing ambient may comprise, for example, $O_2$, $N_2O$, NO, ozone ($O_3$), UV $O_2$, or other suitable oxidizing ambient. The second anneal is a preferably performed at 64 at a lower temperature than the first anneal at 62 (e.g., room temperature to 1000° C.), and may be a thermal anneal, with or without UV exposure, or a low temperature plasma process, wherein the process temperature, time and pressure may be selected so as not to significantly increase the material EOT. In this regard, reduced pressure may be helpful in avoiding oxide growth (increased EOT), wherein reduced pressures may allow higher temperatures during the second anneal at 64.

For example, the second anneal may be performed at about 700 degrees C. in an $O_2$ ambient for about 60 sec at 1 Torr. The first and second anneals at 60, as well as the nitridation 70 and/or the post-nitridation anneals at 80 may be separate processes or may be run as separate steps within one recipe. For example, depending on the anneal tool configuration, the dual pre-nitridation anneals at 60 may be performed in a single processing run with a multi-step annealing recipe. The second anneal at 64 may alternatively comprise exposing the high-k dielectric layer to an oxidizing liquid solution, such as $H_2O+H_2O_2$, $H_2O+O_3$, $H_2SO_4+H_2O_2+H_2O$, $H_2SO_4+H_2O$, $HNO_3+H_2O$, $HNO_3+H_2O_2+H_2O$, $HCl+H_2O_2+H_2O$, or $NH_4 OH+H_2O_2+H_2O$. Suitable liquid based oxidation surface treatments are set forth in U.S. patent application Ser. No. 10,232,124, filed on Aug. 30, 2002, assigned to the assignee of the present invention Texas Instruments Incorporated, the entirety of which is hereby incorporated by reference as if fully set forth herein.

In another alternative, the second anneal at 64 may comprise an oxidizing plasma process at 700 degrees or less (e.g., low temperature oxidizing plasma process). In this case, the high-k material 120 is exposed to an oxygen plasma in an ambient including, for example, $O_2$ with one or more of Ar, $N_2O$ or NO, where the plasma provides energized oxygen ions to the high-k material 120. In another possible implementation, the second anneal at 64 can be an ozone anneal, wherein the process ambient includes $O_3$. In still another possibility, the second anneal can be a low temperature anneal (e.g., less than about 700 degrees C.) with UV excitation, for example, wherein $O_2$ gas is energized with UV lamps to create atomic oxygen or $O_3$ that are provided to the high-k material 120.

Thereafter at 70, a plasma nitridation process is performed (process 128 in FIG. 3E) to introduce nitrogen into the high-k material 120. The plasma nitridation at 70 may be performed according to any suitable process parameters. One possible implementation is described in U.S. Pat. No. 6,136,654, issued Oct. 24, 2000 to Kraft et al., assigned to the assignee of the present invention Texas Instruments Incorporated, the entirety of which is hereby incorporated by reference as if fully set forth herein. In two possible implementations, the nitridation at 70 may comprise a nitridation anneal, for example, in an $NH_3$ (e.g., ammonia) ambient, or a plasma nitridation process. In the case of an ammonia anneal, the nitridation at 70 may be performed in the same process tool used for the pre and/or post anneals at 60 and 80.

The introduction of nitrogen can be used to block boron diffusion, thermally stabilize the film (e.g., raise the temperature of crystallization or phase separation), and to increase the dielectric constant k. For example, for deposited HfSiO, the nitridation at 70 creates HfSiON, which may be thermally stable above about 1100 degrees C. without crystallizing. Where the deposited film 120 already includes nitrogen, the nitridation 70 can be employed to tune the nitrogen content/profile through the depth of the film. In order to avoid having nitrogen at the interface, this nitridation step 70 can be advantageously employed, for example, to introduce nitrogen primarily near the top of the film 120. In the case of an ammonia ($NH_3$) anneal, the nitridation temperature may be about 1000 degrees C. or less. Plasma nitridation can alternatively be employed at 70, for example, including performing a decoupled-plasma-nitridation (DPN) or slot-plane-antenna (SPA) plasma nitridation process.

The inventors have appreciated that although the pre-nitridation anneals at 60 facilitate defect/impurity reduction and densification, some defects/impurities may remain prior to the nitridation at 70. Furthermore, the nitridation at 70 itself may cause defects and/or introduce impurities in the high-k dielectric 120. For instance, an ammonia anneal at 70 can introduce H into the film 120, and may also renitride the substrate/high-k interface slightly. For a plasma nitridation at 70, the incoming nitrogen atoms are energized, and can knock oxygen out of the film 120, thereby creating new oxygen vacancies. Thus, the nitridation at 70 can recreate some of the defects that the pre-nitridation anneal 60 was meant to cure.

Accordingly, the method 50 further comprises one or more post-nitridation anneals at 80. The post-nitridation anneals densify the material 120 through inert annealing at high temperature, and reoxidize the material 120, wherein the reoxidation operates to heal defects caused by the nitridation 70, eliminate hydrogen, potentially regrow the interface to inhibit interface nitridation between the substrate 104 and the high-k material 120, and to fix oxygen vacancies in the film 120. In the exemplary method 50, the post-nitridation anneals 80 include a high temperature inert anneal at 82 to densify the film through slight atomic rearrangement without crystallization (third anneal process 130 in FIG. 3F). This third anneal at 82 can be greater than about 1000 degrees C. in an inert ambient (e.g., comprising $N_2$, Ar, He, or Ne) for HfSiON or other high-k materials 120 due to the thermal stabilization afforded by the nitridation at 70. Alternatively, any other suitable non-oxidizing anneal can be used at 82 that does not drastically change the film composition profile (e.g., below the crystallization temperature).

At 84, a fourth anneal is performed (e.g., anneal process 132 in FIG. 3G) at a mild temperature in an oxidizing ambient to fix the high-k material composition and heal any remaining defects in the film 120. The fourth anneal at 84 is preferably performed at a temperature of about 1000 degrees C. or less, for example, about 700 degrees C. or less, and at a pressure of about 1 Torr or less in one example, or at atmospheric pressure in another example. As with the second anneal at 64, the fourth anneal may be any suitable oxidizing anneal process, such as exposing the high-k dielectric layer to an oxidizing liquid solution (e.g., $H_2O+H_2O_2$, $H_2O+O_3$, $H_2SO_4+H_2O_2+H_2O$, $H_2SO_4+H_2O$, $HNO_3+H_2O$, $HNO_3+H_2O_2+H_2O$, $HCl+H_2O_2+H_2O$, $NH_4OH+H_2O_2+H_2O$, etc.), an oxidizing plasma process, an ozone anneal, a low temperature anneal with UV excitation, etc.

Figure 3I:
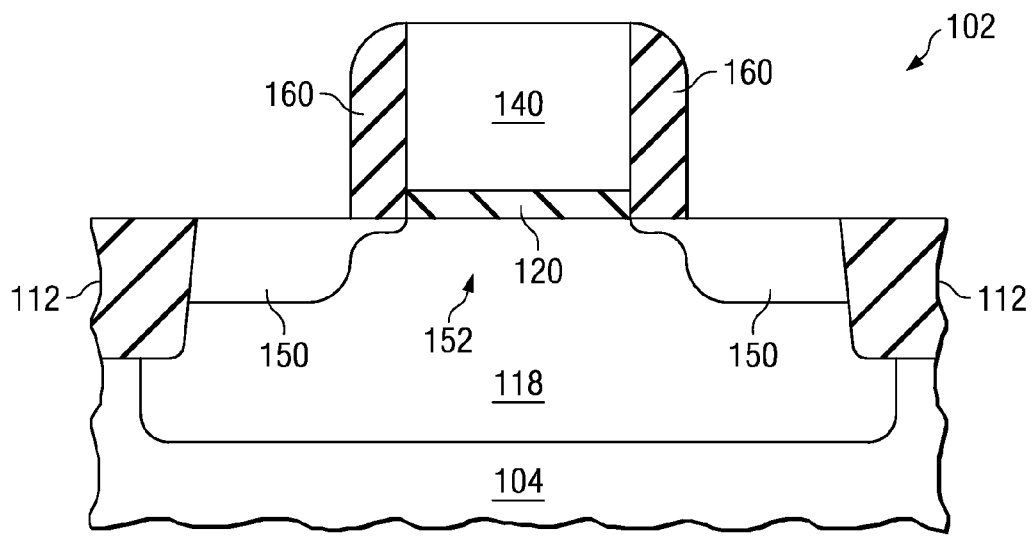

One, some or all of the anneals 60, 80, and the nitridation 70 may be performed in a single process tool, for example, where the nitridation at 70 is an $NH_3$ anneal. Thereafter at 90, polysilicon gate electrode material is formed over the high-k dielectric 120 (e.g., polysilicon layer 140 deposited via a deposition process 142 in FIG. 3H). At 92, the gate dielectric and gate electrode material layers are patterned to create a patterned gate structure over a prospective channel region of the underlying semiconductor body, and the gate fabrication method 50 ends at 94. Further processing is then performed as illustrated in FIG. 3I to implant source/drain regions 150 in the substrate 104 and to form sidewall spacers 160 along the lateral sides of the patterned gate structure. Silicidation and metalization processing is thereafter performed (not shown) to complete the fabrication of the device 102.

Figure 4:
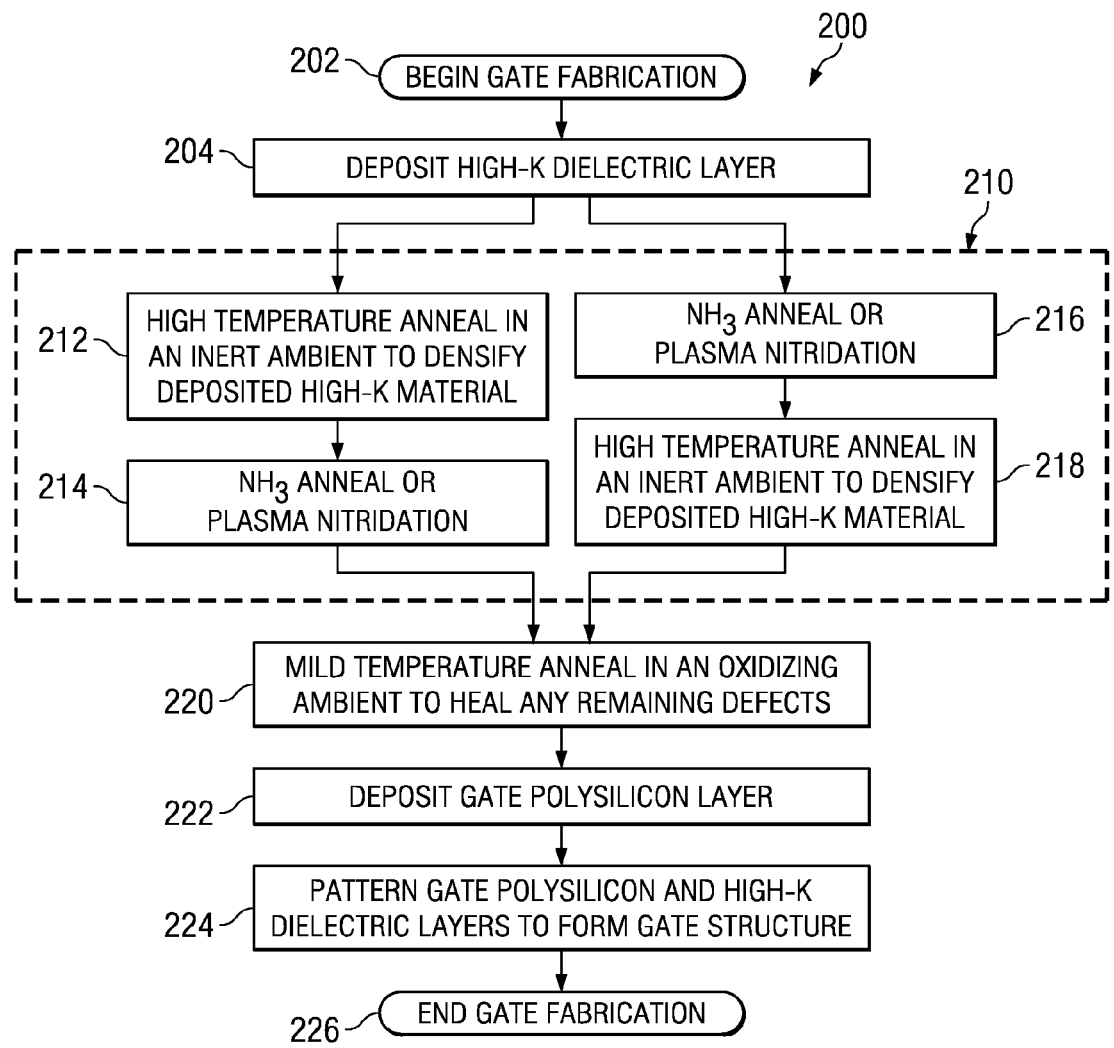
FIG. 4 is a flow diagram illustrating another exemplary method of fabricating transistor gate structures in which a deposited high-k gate dielectric material layer undergoes a high temperature non-oxidizing anneal prior to nitridation or undergoes nitridation prior to a high temperature inert non-oxidizing anneal in accordance with the invention.

Referring now to FIG. 4, another aspect of the invention provides for dual high-k gate dielectric annealing (an oxidizing anneal and a non-oxidizing anneal) with material nitridation, wherein these three processes may be performed in any order following the high-k deposition and before formation of an overlying gate electrode material. FIG. 4 illustrates another method 200 for gate fabrication in accordance with this aspect of the invention, beginning at 202, wherein the nitridation may be performed prior to both anneals or between two anneals. A high-k gate dielectric material layer is deposited at 204, which may form any high-k material such as those described above via any suitable deposition process (e.g., CVD, PVD, ALD, MBE, etc.).

Thereafter, a three step treatment is performed at 210, including a nitridation, an oxidizing anneal, and a non-oxidizing anneal. In one implementation, the method 200 proceeds to 212, where a first anneal is performed in a non-oxidizing ambient at relatively high temperature. The first anneal temperature is selected to densify the high-k material without crystallization. Where the high-k material is initially deposited to include nitrogen, the first anneal temperature at 212 can be higher than for material not initially deposited with nitrogen. For example, where HfSiO is deposited at 204, the first anneal at 212 is preferably performed at a temperature of about 1000 degrees C. or less, more preferably at about 700 to 900 degrees C. in an inert ambient (e.g., $N_2$, Ar, He, or Ne) to reduce the likelihood of crystallization. For HfSiON deposited at 204, the non-oxidizing first anneal at 212 may be performed at temperatures up to about 1100 degrees C.

At 214, the densified high-k material is nitrided using any suitable nitridation process, such as those described above. In one example, the nitridation at 214 comprises performing a nitridation anneal in a nitrogen containing ambient, such as annealing at about 1000 degrees C. or less in an ammonia ($NH_3$) ambient. In another possible implementation, the nitridation at 212 is a plasma nitridation process (e.g., SPA, DPN, etc.).

Thereafter at 220, a second anneal is performed in an oxidizing ambient to heal oxygen defects, and to eliminate or reduce carbon, hydrogen, chlorine, or other impurities, including those associated with the deposition process at 204 as well as those associated with the nitridation at 214. In one implementation, the second anneal at 220 is performed at a temperature of about 1000 degrees C. or less, preferably about 700 degrees C. or less, at atmospheric pressure or a pressure of about 1 Torr or less. The oxidizing ambient may comprise, for example, $O_2$, $N_2O$, NO, ozone ($O_3$), UV $O_2$, or other suitable oxidizing ambient. The second anneal at 220, moreover, may be a thermal anneal, with or without UV exposure, or a low temperature oxidizing plasma process, wherein the process temperature, time and pressure may be selected so as not to significantly increase the material EOT, such as the oxidizing anneals described above. In another example, the second anneal at 220 may comprise exposing the high-k dielectric layer to an oxidizing liquid solution, such as $H_2O+H_2O_2$, $H_2O+O_3$, $H_2SO_4+H_2O_2+H_2O$, $H_2SO_4+H_2O$, $HNO_3+H_2O_2+H_2O$, $HCl+H_2O_2+H_2O$, or $NH_4OH+H_2O_2+H_2O$, as described above.

Following the second anneal at 220, a gate electrode material (e.g., polysilicon, etc.) is deposited at 222 over the treated high-k dielectric, using any suitable deposition process. At 224, the treated high-k gate dielectric and gate electrode material layers are patterned to provide a patterned gate structure over the semiconductor body, and the gate fabrication method 200 ends at 226. It is noted in this example, that the first anneal at 212 may need to be performed at a moderate temperature, particularly for non-nitrogen containing materials deposited at 204, since the nitridation (e.g., thermal stabilization) at 214 is after the first anneal at 212. However, it is further noted that the nitridation 214 itself may be facilitated by densification of the high-k material through annealing at 212, which may improve tailoring of the nitrogen content and profile in the high-k material.

In another exemplary implementation of the method 200, the post-deposition nitridation is performed prior to both of the anneal processes. After the high-k deposition at 204, the method 200 proceeds to 216, where the high-k material is nitrided using any suitable nitridation process (e.g., a nitridation anneal in a nitrogen containing ambient, SPA or DPN plasma nitridation, etc., as described above). In this example, the high-k material has not been densified at the time of the nitridation 216, but the nitridation at 216 may advantageously allow higher temperature densification annealing by thermally stabilizing the material prior to the densification (e.g., non-oxidizing) anneal at 218.

After the nitridation at 216, the method proceeds to 218, where a first anneal is performed in a non-oxidizing ambient to densify the material. The first anneal can be performed according to any of the non-oxidizing anneal examples set forth above, wherein the annealing temperature may be relatively high because the high-k material has been thermally stabilized by the nitridation at 216. In this example, the incorporation of nitrogen at 216 may proceed at a higher rate in the non-densified material than for the above case where the material is first densified (e.g., 212 and 214 in FIG. 4), which may be advantageous for non-nitrogen containing deposited films. Thereafter, the method 200 proceeds to the second (e.g., oxidizing) anneal 220, electrode deposition 222 and patterning at 224 as described above, before the method 200 ends at 226.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for treating a deposited high-k gate dielectric layer during fabrication of a semiconductor device, the method comprising:
   nitriding a deposited high-k gate dielectric layer prior to forming a gate electrode;
   performing a first anneal of the deposited high-k gate dielectric layer in a non-oxidizing ambient prior to nitriding the deposited high-k gate dielectric layer; and
   performing a second anneal of the deposited high-k gate dielectric layer in an oxidizing ambient prior to forming a the gate electrode and after nitriding the high-k gate dielectric layer.

2. The method of claim 1, wherein the first anneal is performed at a temperature of about 1000 degrees C. or less.

3. The method of claim 2, wherein the first anneal is performed at a temperature of about 900 degrees C. or less.

4. The method of claim 3, wherein the first anneal is performed at a temperature of about 700 degrees C. or more.

5. The method of claim 3, wherein the non-oxidizing ambient of the first anneal comprises $N_2$, Ar, He, or Ne.

6. The method of claim 2, wherein the non-oxidizing ambient of the first anneal comprises N2, Ar, He, or Ne.

7. The method of claim 1, wherein the non-oxidizing ambient of the first anneal comprises N2, Ar, He, or Ne.

8. The method of claim 1, wherein the second anneal is performed at a temperature of about 1000 degrees C. or less.

9. The method of claim 8, wherein the second anneal is performed at a temperature of about 700 degrees C. or less.

10. The method of claim 9, wherein the second anneal is performed at a pressure of about 1 Torr or less.

11. The method of claim 9, wherein the second anneal is performed at atmospheric pressure.

12. The method of claim 8, wherein performing the second anneal comprises exposing the high-k gate dielectric layer to an oxidizing liquid solution.

13. The method of claim 12, wherein the oxidizing liquid solution comprises $H_2O+H_2O_2$.

14. The method of claim 12, wherein the oxidizing liquid solution comprises $H_2O+O_3$.

15. The method of claim 12, wherein the oxidizing liquid solution is taken from the group consisting of $H_2SO_4+H_2O_2+H_2O$, $H_2SO_4+H_2O$, $HNO_3+H_2O$, $HNO_3+H_2O_2+H_2O$, $HCl+H_2O_2+H_2O$, and $NH_4OH+H_2O_2+H_2O$.

16. The method of claim 8, wherein the second anneal is an oxidizing plasma process.

17. The method of claim 8, wherein the second anneal is an ozone anneal.

18. The method of claim 8, wherein the second anneal is a low temperature anneal with UV excitation in an oxidizing ambient.

19. The method of claim 1, further comprising performing a third anneal in a non-oxidizing ambient after nitriding the deposited high-k dielectric layer.

20. The method of claim 19, wherein the third anneal is performed at a temperature above about 1000 degrees C.

21. The method of claim 20, wherein the non-oxidizing ambient of the third anneal comprises N2, Ar, He, or Ne.

22. The method of claim 19, wherein the non-oxidizing ambient of the third anneal comprises N2, Ar, He, or Ne.

23. The method of claim 19, wherein nitriding the deposited high-k gate dielectric layer comprises performing a nitridation anneal in a nitrogen containing ambient.

24. The method of claim 23, wherein the nitridation anneal is performed at a temperature of about 1000 degrees C. or less and wherein the nitrogen containing ambient comprises $NH_3$.

25. The method of claim 19, wherein nitriding the deposited high-k gate dielectric layer comprises performing a plasma nitridation process.

26. The method of claim 19, further comprising performing a fourth anneal in an oxidizing ambient after performing the first anneal and prior to nitriding the high-k gate dielectric layer.

27. The method of claim 26, wherein the fourth anneal is performed at a temperature of about 700 degrees C. or less.

28. The method of claim 27, wherein the fourth anneal is preformed at a pressure of about 1 Torr or less.

29. The method of claim 27, wherein the fourth anneal is performed at atmospheric pressure.

30. The method of claim 26, wherein performing the fourth anneal comprises exposing the high-k dielectric layer to an oxidizing liquid solution.

31. The method of claim 26, wherein the oxidizing liquid solution comprises $H_2O+H_2O_2$.

32. The method of claim 26, wherein the oxidizing liquid solution comprises $H_2O+O_3$.

33. The method of claim 26, wherein the oxidizing liquid solution is selected from the group consisting of $H_2SO_4+$ $H_2O_2+H_2O$, $H_2SO_4+H_2O$, $HNO_3+H_2O$, $HNO_3+H_2O_2+H_2O$, $HCl+H_2O_2+H_2O$, and $NH_4OH+H_2O_2+H_2O$.

34. The method of claim 26, wherein the fourth anneal is an oxidizing plasma process.

35. The method of claim 26, wherein the fourth anneal is an ozone anneal.

36. The method of claim 26, wherein the fourth anneal is a low temperature anneal with UV excitation in an oxidizing ambient.

37. The method of claim 1, wherein nitriding the deposited high-k gate dielectric layer comprises performing a nitridation anneal in a nitrogen containing ambient.

38. The method of claim 37, wherein the nitridation anneal is performed at a temperature of about 1000 degrees C. or less and wherein the nitrogen containing ambient comprises $NH_3$.

39. The method of claim 1, wherein nitriding the deposited high-k gate dielectric layer comprises performing a plasma nitridation process.

40. A method of fabricating a transistor gate structure, the method comprising:

depositing a high-k gate dielectric layer above a semiconductor body; nitriding a deposited high-k gale dielectric layer;

performing a first anneal of the deposited high-k gate dielectric in a non-oxidizing ambient prior to nitriding the deposited high-k gate dielectric layer;

performing a second anneal of the deposited high-k gate dielectric in an oxidizing ambient after nitriding the deposited high-k gate dielectric layer;

forming a gate electrode material layer above the gate dielectric layer after nitriding and after performing the first and second anneals; and patterning the gate electrode and gate dielectric layers to form a patterned gate structure.

* * * * *